United States Patent
Chiang

(10) Patent No.: US 6,768,431 B2
(45) Date of Patent: Jul. 27, 2004

(54) SERIAL-TO-PARALLEL DATA CONVERTER AND METHOD OF CONVERSION

(75) Inventor: Chin-Yi Chiang, HsinTien (TW)

(73) Assignee: VIA Technologies Inc., Hsin Tien (TW)

( * ) Notice: Subject to any disclaimer, the term of this patent is extended or adjusted under 35 U.S.C. 154(b) by 0 days.

(21) Appl. No.: 10/287,662

(22) Filed: Nov. 5, 2002

(65) Prior Publication Data
US 2003/0193424 A1 Oct. 16, 2003

(30) Foreign Application Priority Data
Apr. 12, 2002 (TW) ........................................ 91107481 A

(51) Int. Cl.[7] .............................................. H03M 9/00
(52) U.S. Cl. ....................................... 341/100; 341/101
(58) Field of Search ................................ 341/100, 101, 341/102, 103

(56) References Cited

U.S. PATENT DOCUMENTS

| | | | | | |
|---|---|---|---|---|---|
| 5,223,833 A | * | 6/1993 | Akata | ........................ | 341/100 |
| 5,426,784 A | * | 6/1995 | Kawata et al. | .............. | 713/600 |
| 6,052,073 A | * | 4/2000 | Carr et al. | ................... | 341/100 |
| 6,198,415 B1 | * | 3/2001 | Yoshikawa et al. | ......... | 341/100 |
| 6,259,387 B1 | * | 7/2001 | Fukazawa | ................... | 341/100 |
| 6,373,414 B2 | * | 4/2002 | Koga et al. | ................. | 341/100 |
| 6,509,851 B1 | * | 1/2003 | Clark et al. | ................. | 341/100 |

* cited by examiner

*Primary Examiner*—Michael Tokar
*Assistant Examiner*—Linh V Nguyen
(74) *Attorney, Agent, or Firm*—Arent Fox

(57) ABSTRACT

The present invention improves the drawback of requiring more clock signals in conventional high-frequency serial-to-parallel conversions that often use multi-phase clock circuits. The needed number of phase clocks is the bit width of the parallel data. In addition to effectively reduce the number of required clocks, the present invention can further solve the setup time problem associated with the switching one of two parallel data receivers as the parallel data output. A pre-register is employed in the converter of the present invention. Since this pre-register does not need switch control, it does not have the setup time problem during parallel data switching.

27 Claims, 5 Drawing Sheets

SERIAL-TO-PARALLEL DATA CONVERTER AND METHOD OF CONVERSION

BACKGROUND OF THE INVENTION

1. Field of Invention

The invention generally relates to a data converter and the method of conversion. More specifically, the invention relates to a serial-to-parallel data conversion circuitry that has an additional pre-register installed in a multi-phase clock architecture to maintain the number of required phase clock signals as same as the number of the width of the parallel data bits.

2. Related Art

High-speed serial transmissions have wide applications nowadays. In the future, they will be applied to both network data transmissions and data transmission within computer systems. Currently, the most common applications of the high-speed serial transmission include: 1394a data transmissions with a bandwidth of 400 Mbps, USB2.0 data transmissions with a bandwidth of 480 Mbps, Serial ATA data transmissions with a bandwidth of from 1.5 Gbps to 6 Gbps•Infiniband and 3GIO data transmissions with a bandwidth of 2.5 Gbps. Although all the above-mentioned high-speed serial transmissions adopt different data coding methods, the receiver of the serial data has to be able to always convert them into a parallel data.

At present, the circuit design for converting serial data to parallel data usually uses a shift register. A shift register is made up of a plurality of latch units, flip-flops (FF), connected in series to each other. As shown in FIG. 1, the serial data enter the shift register in order. Once the shift register collects full the serial data, the data stored by the FF 1 are output in parallel. Although this circuit is simple in design, serial data transmissions for high speed require improvement in the manufacturing technology in order to achieve the speed requirement of the shift register. To solve this problem, a multi-clock phase architecture was developed to replace the shift register one. In spite of the fact that this multi-clock phase architecture can effectively increase the conversion speed limitation of serial data, it at the same time demands more phase clock signals. If the parallel data output design in incorporated, this type of circuitry generally adopts the conversion structure with twice the width of the parallel data bits. With reference to FIG. 2, when one shift register receives serial data, another shift register outputs the parallel data. Nevertheless, the drawback of this design is that clock signals with twice the parallel data width and different phases are needed. Precision clocks are the key to the technical application.

SUMMARY OF THE INVENTION

An objective of the present invention is to provide a serial-to-parallel data conversion method, which under a multi-clock phase architecture only need to generate the number of phase clock signals with the same width as the parallel data.

As described before, the conventional conversion technology requires phase clock signals with twice the width of the parallel data in the multi-clock phase architecture and the precision clock signals under high-frequency operations are the key factor in the conversion technology. The circuit design becomes so complicated that the manufacturing cost also increases. Therefore, the present invention provides a solution to make serial-to-parallel data conversions that can operate at a high-frequency. In a preferred embodiment of the present invention, a serial-to-parallel data converter for converting a serial data into a n-bit parallel data, comprises: a latch circuit, comprised of a first data receiver and a second data receiver for storing the n-bit parallel data; a phase clock generator, generates n phase clocks corresponding to the n-bit parallel data in a conversion cycle and simultaneously latches the corresponding bits in the first data receiver and the second data receiver at each phase clock; and a selector, selects one of the first data receiver and the second data receiver to perform serial data conversion and the other receiver to output parallel data.

Another embodiment of the present invention further solves the problem that under high-frequency operations, the switching between different data receivers for serial data conversion and parallel data storage may result in incomplete parallel data reception. In this embodiment, the disclosed serial-to-parallel data converter for converting a serial data into a n-bit parallel data, comprises: a latch circuit, comprised of a first data receiver and a second data receiver for storing the n-bit parallel data; a phase clock generator, generates n phase clocks corresponding to the n-bit parallel data in a conversion cycle and simultaneously latches the corresponding bits in the first data receiver and the second data receiver at each phase clock; a pre-register, stores the first m bits of the parallel data in advance in each conversion cycle and shifts the pre-stored first m bits back to the first data receiver and the second data receiver before each conversion ends; and a selector, switches between the first data receiver and the second data receiver to perform serial data conversion and the other receiver to output parallel data.

The above embodiment utilizes an additional pre-register to store in advance the bits that may be lost when the selector switches, so that the data receiver can receive the complete parallel data without any mistakes and the number of phase clocks is equal to the width of the bits in the parallel data.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

The disclosed serial-to-parallel data conversion method converts a serial data into a n-bit parallel data for output. The method includes the steps of: generating n phase clock signals corresponding to the n-bit parallel data in a conversion cycle, within which the serial data is converted into the n-bit parallel data; using the n phase clock signals to convert the serial data into n-bit first parallel data and second parallel data within the conversion cycle; and selecting one from the first parallel data and second parallel data as the parallel data for output and the other for serial data conversions. In particular, the corresponding bit data in the first parallel data and the second parallel data refer to the same phase clock signal to latch the serial data. Therefore, the serial-to-parallel data conversion does not need to refer to 2n phase clock signals.

Figure 1:
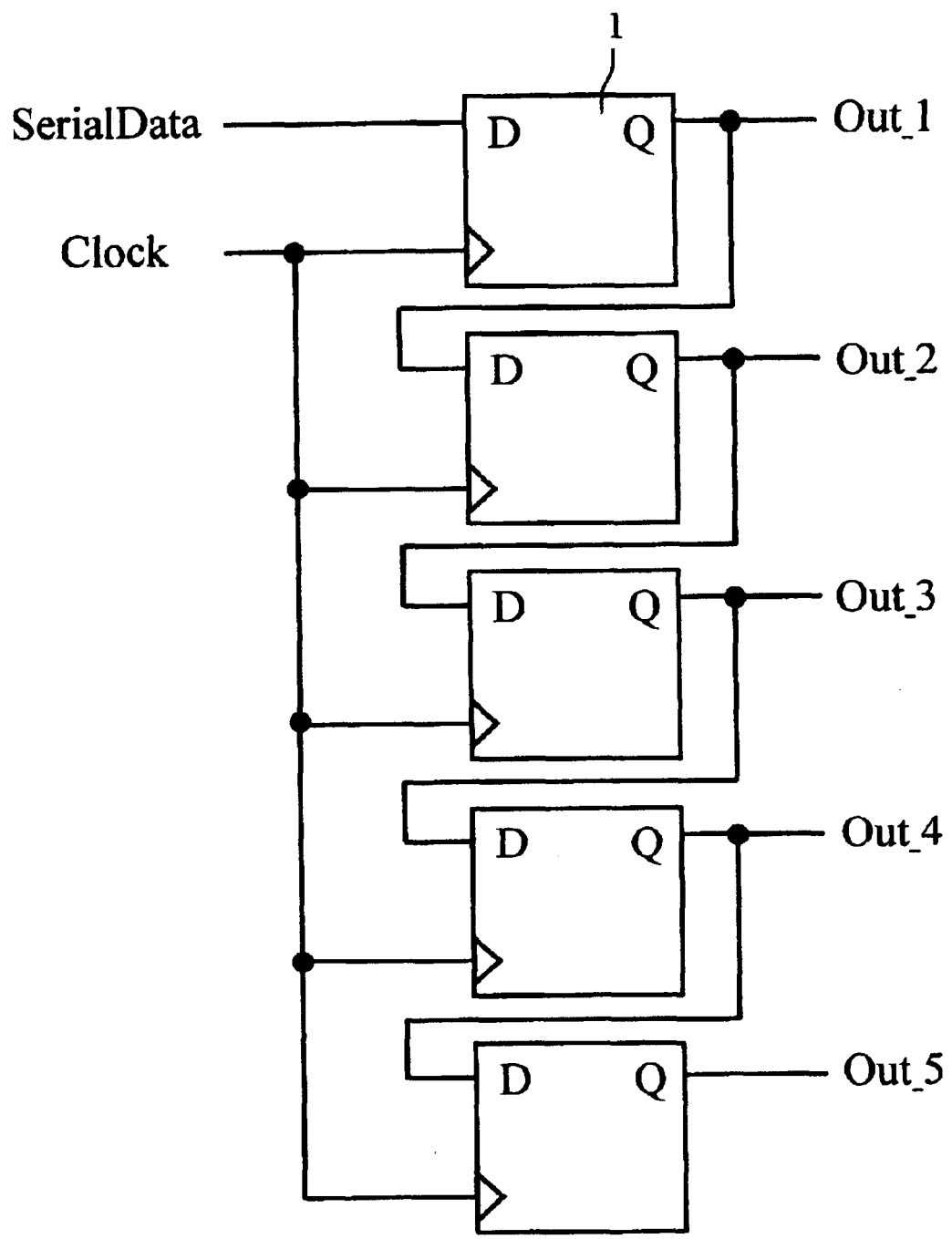
FIG. 1 is a conventional latch circuit diagram for serial-to-parallel data conversions.
Figure 2:
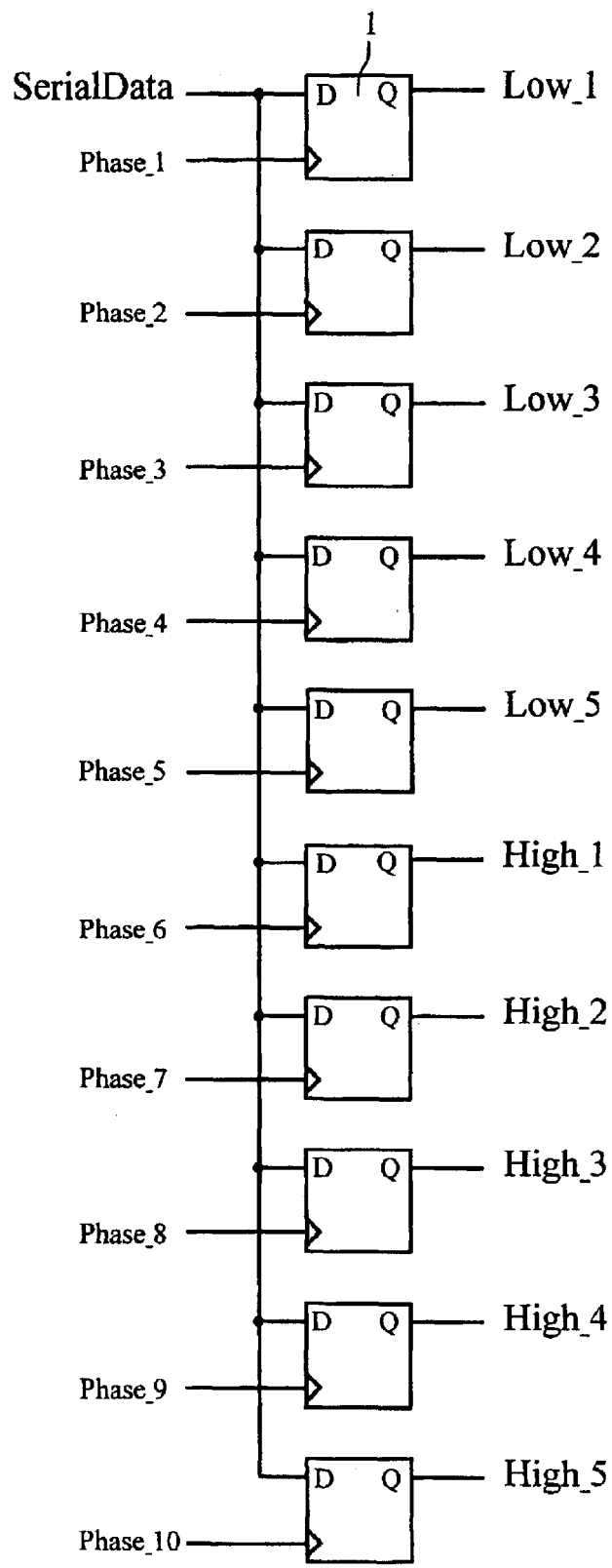
FIG. 2 is a conventional latch circuit diagram for serial-to-parallel data conversions in a multi-clock phase architecture.
Figure 3:
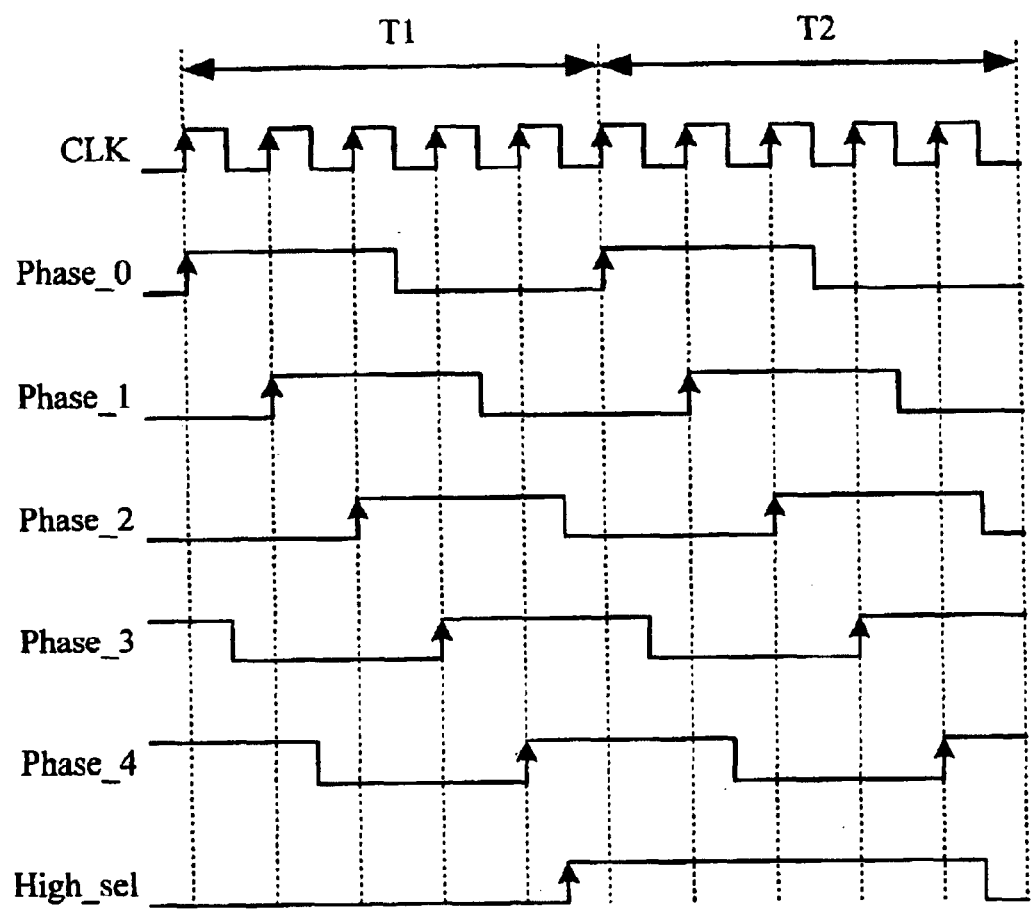
FIG. 3 is a timing diagram of serial-to-parallel data conversion in accord with the present invention.

With reference to FIG. 3, a 5-bit parallel data conversion is employed to explain a preferred embodiment of the present invention. The conversion of the serial data into 5-bit parallel data for output has to generate 5 phase clocks Phase_0, Phase_1, Phase_2, Phase_3, and Phase_4 corresponding to the parallel data in a conversion cycle. This can be implemented using a phase clock generator. These phase clocks refer to a work clock CLK to have a rising edge of the clock in order within a conversion cycle. The first parallel data and the second parallel data simultaneously refer to the 5 phase clocks in order to latch the serial data in order. That is, each corresponding bit datum of the first parallel data and the second parallel data refers to the same phase clock signal to latch the serial data. During different conversion cycles T1 and T2, one of the first parallel data and the second parallel are selected as the output parallel data and the other for serial data conversion. For example, if the first parallel data are selected as the output data during the conversion cycle T1, the input serial data is converted into the second parallel data; whereas when the second parallel data are selected as the output data during the conversion cycle T2, the input serial data is converted into the first parallel data. This alternating method allows the following device enough time to catch the latched parallel data during the conversion cycle.

Figure 4:
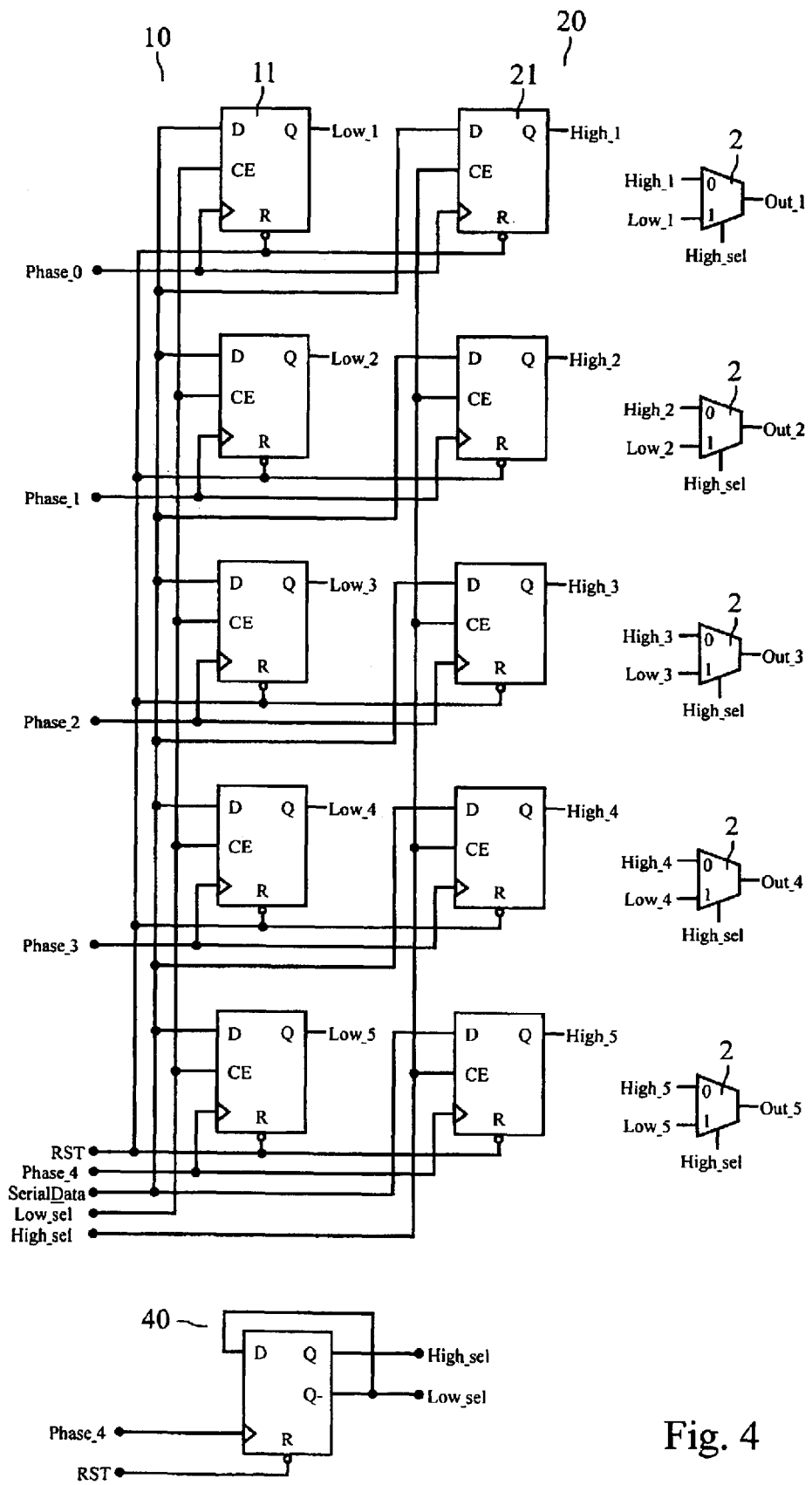
FIG. 4 is a latch circuit diagram for serial-to-parallel data conversions in a multi-clock phase architecture in accord with the present invention.

With reference to FIG. 4, in this embodiment a serial-to-parallel data converter is described in accord with the above disclosed serial-to-parallel data conversion method of the present invention. The multi-clock phase architecture comprises a phase clock generator (not shown in the drawing) for generating 5 phase clocks. These 5 phase clocks simultaneously drive a first data receiver 10 and a second data receiver 20. Each data receiver is comprised of a latch circuit 11, 21. The latch circuit is a D-type flip-flop (FF) with an enable signal. The output Q of such a FF remains invariant when the enable signal CE is at a low level L. In the first data receiver 10 and the second data receiver 20, the D-type FF for storing the corresponding bit of parallel data refer to the same phase clock. For example, the D-type FF 11 of the first data receiver 10 and the D-type FF 21 of the second data receiver 20 store the first bit of parallel data and driven by the same phase clock Phase_1.

The disclosed serial-to-parallel data converter further comprises a selector 40 for generating selection signals High_sel and Low_sel. The selection signals High_sel and Low_sel connect to the enable signal CE of the second data receiver 20 and the first data receiver 10, respectively, for switching between the output of the first data receiver 10 and the second data receiver 20 as the parallel data output. A multiplex 2 refers to the selection signal High_sel for extracting the parallel data and outputs the signals Out_1, Out_2, Out_3, Out_4, and Out_5.

With further reference to FIG. 4, when the work speed of the processor becomes faster, the serial-to-parallel data conversions are operating at high frequencies. When the selection signal High_sel assigns the serial data to transfer from the first data receiver 10 to the second data receiver 20, the work period may be so short that bit data may be lost, resulting in incomplete data transmissions. Therefore, the present invention employs a pre-register to store in advance the bit data that may be lost. A D-type FF without enable control is used to solve the setup time problem.

In a preferred embodiment of the present invention, the high-frequency serial-to-parallel data conversion method for converting a serial data into a n-bit parallel data is disclosed. The method comprises the steps of: generating n phase clock signals corresponding to the n-bit parallel data in a conversion cycle, within which the serial data is converted into the n-bit parallel data; using the n phase clock signals to convert the serial data into a first n-bit parallel data and a second n-bit parallel data within the conversion cycle; and selecting and latching one of the first parallel data and the second parallel data as output data. Each corresponding bit datum in the first parallel data and the second parallel data refers to the same phase clock signal to latch the serial data. In each conversion cycle, the additional m D-type FFs without an enable signal store in advance the first m bits in the serial data, so that the first parallel data and the second parallel data do not lose the first m bits when the selection signal changes.

Figure 5:
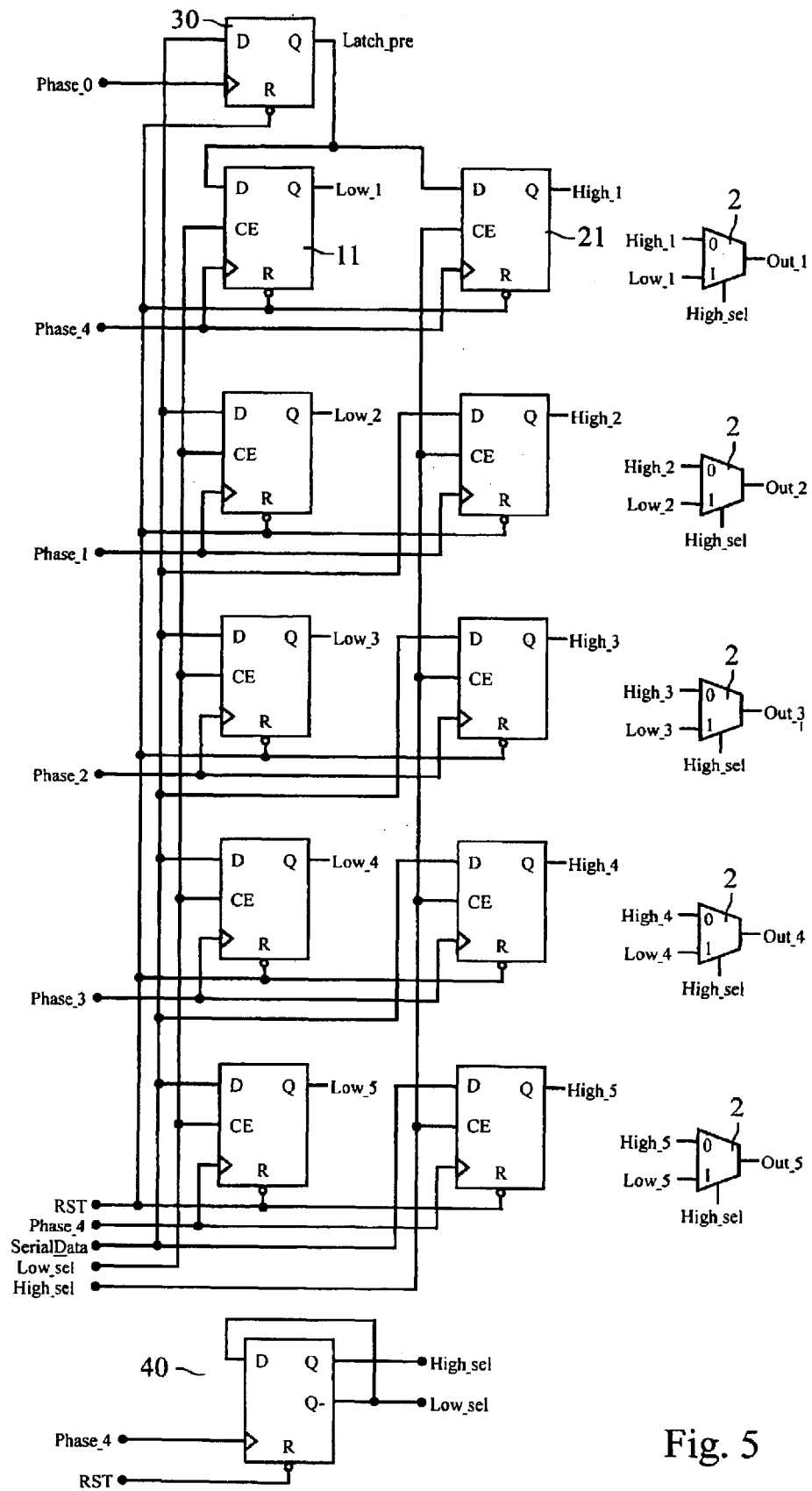
FIG. 5 is the latch circuit diagram in another embodiment of the serial-to-parallel data conversions.

As shown in FIG. 5, a 5-bit serial-to-parallel data conversion is illustrated as an example to practice the embodiment of the present invention. The high-frequency serial-to-parallel data converter for converting a serial data into a 5-bit parallel data, comprises: a first data receiver 10 and a second data receiver 20, comprised of five D-type FFs 11, 21 with enable control to store the 5-bit parallel data, respective; a phase clock generator (not shown), for generating five phase clocks Phase_0, Phase_1, Phase_2, Phase_3, and Phase_4 in a conversion cycle, as shown in FIG. 4, each phase clock is simultaneously provided to the associated parallel data bits (High_1 and Low_1, High_2 and Low_2, etc) in the first data receiver 10 and the second data receiver 20; and a selector 40, for generating selection signals High_sel and Low_sel, which connect respectively to the enable signals CE of the second data receiver 20 and the first data receiver 10, and controlling the output latch of one of the first data receiver 10 and the second data receiver 20. A multiplex 2 refers to the selection signal High_sel to pick the parallel data output Out_1, Out_2, Out_3, Out_4, and Out_5.

In this embodiment, the high-frequency serial-to-parallel data converter further comprises a pre-register comprised of at least one D-type FF. The pre-register 30 first store in advance the first m bit(s) of the serial data in each conversion cycle, where m≧1. The stored first m bits are shifted back to one of the first data receiver 10 and the second data receiver 20 before each conversion cycle ends. In the embodiment shown in FIG. 5, m=1 is illustrated as an example for explanation. Since the work cycle is so short, bit data may occur during the switches between the first data receiver 10 and the second data receiver 20. Therefore, in each conversion cycle, the pre-register 30 which is a D-type FF latches the first bit of the serial data at the rising edge of phase clock Phase_0. Before each conversion cycle ends, the selection signals High_sel, Low_sel are referred to use the rising edge of the phase clock Phase_4 to shift Latch_pre of the pre-register 30 back to either Low_1 of the D-type FF 11 in the first data receiver 10 or High_1 of the D-type FF 21 in the second data receiver 20. This ensures that in each conversion cycle the latch circuit can completely store the 5-bit parallel data in Low_1, Low_2, Low_3, Low_4, and Low_5 of the first data receiver 10 and High_1, High_2, High_3, High_4, and High_5 of the second data receiver 20.

In consideration of high-frequency operations, to ensure that serial-to-parallel data conversions can be completely stored in the latch circuit, the pre-register 30 implemented in the serial-to-parallel data converter of the present invention can be made of two or even more than two D-type FFs. For example, m=2 is considered and the pre-register 30 latches the first and second bits of the serial data at the rising edges of Phase_1 and Phase_2 in each conversion cycle. The pre-register 30 refers to the selection signals High_sel and Low_sel before each conversion cycle ends, using the rising edge of the phase clock Phase_4 to shift the first and second bits in the pre-register 30 back to one of the first data receiver 10 and the second data receiver 20. Therefore, in each conversion cycle, the latch circuit can completely store five bits of parallel data in Low_1, Low_2, Low_3, Low_4, and Low_5 of the first data receiver 10 or High_1, High_2, High_3, High_4, and High_5 of the second data receiver 20.

After the detailed description of the embodiments of the invention, those skilled in the art can readily make various equivalent changes and modifications. For example, the number of the D-type FFs in the pre-register can be increased as the work frequency of the processor becomes high to guarantee data pre-storage.

EFFECTS OF THE INVENTION

In high-frequency operations, doubling the number of D-type FFs for storing parallel data does not require the doubling number of phase clocks in the disclosed serial-to-parallel data converter and the conversion method. Furthermore, the present invention uses the pre-register to solve the problem of being unable to latch serial data in time.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A serial-to-parallel data converter for converting a serial data into a n-bit parallel data, comprising:
   a first data receiver, composed of n flip-flops for latching the n-bit parallel data referring n phase clock signals in a conversion cycle;
   a second data receiver, composed of n flip-flops with inputs connected in parallel with inputs of the first data receiver, for latching the n-bit parallel data by referring said n phase clock signals in said conversion cycle;
   a pre-register, composed of m flip-flop(s) for latching the first m bit(s) of the n-bit parallel data and output(s) thereof connected to the inputs of flip-flops in the first data receiver and the second data receiver corresponding to the first m bit(s); wherein the inputs of the pre-register receive the serial data, and the first m bit(s) is shifted back to one of the first data receiver and the second data receiver before each conversion cycle ends; and
   a selector, connected to the flip-flops of the first data receiver and the second data receiver for selecting one of the first data receiver and the second data receiver for serial data conversion and the other for parallel data output.

2. The converter of claim 1, wherein the flip-flops of the first data receiver and the second data receiver are D-type flip-flops with enable control.

3. The converter of claim 2, wherein the D-type flip-flops for storing corresponding bits of the n-bit parallel data in the first data receiver and the second data receiver refer to the same phase clock for latching the serial data.

4. The converter of claim 3, wherein the first data receiver and the second data receiver refer to the same n phase clocks.

5. The converter of claim 1, wherein the flip-flop(s) of the pre-register is D-type flip-flop(s) without enable control.

6. The converter of claim 5, wherein the pre-register in each conversion cycle refers to m phase clocks to store in order the first m bit(s) in the n-bit parallel data.

7. The converter of claim 6, wherein the pre-register in each conversion cycle shifts the stored first m bit(s) back to one of the first data receiver and the second data receiver at a time selected from the last phase clock and the rising edge of the last phase clock referred thereby.

8. The converter of claim 1 further comprising a multiplexer, which receives data from the outputs of the first data receiver and the second data receiver and connects to the selector for determining one of the outputs of the first data receiver and the second data receiver as the parallel data output.

9. The converter of claim 1, wherein $m \geq n$.

10. The converter of claim 1, wherein $m < n$.

11. A serial-to-parallel data converter for converting a serial data and outputting a n-bit parallel data, comprising:
    a phase clock generator for generating n phase clocks corresponding to the n-bit parallel data in a conversion cycle;
    a first data receiver and a second data receiver, which refer to the n phase clocks to latch the n-bit parallel data, wherein the corresponding bits of the n-bit parallel data latched in the first data receiver and the second data receiver refer to the same phase clock;
    a pre-register, which receives the serial data, refers to the first m phase clocks for latching the first m bits of the n-bit parallel data and shifts the first m bits stored therein back to one of the first data receiver and the second data receiver before each conversion cycle ends; and
    a selector, which selects one of the first data receiver and the second data receiver for serial data conversion and the other for parallel data output.

12. The converter of claim 11, wherein the first data receiver and the second data receiver are D-type flip-flops with enable control.

13. The converter of claim 12, wherein the inputs of the flip-flops in the second data receiver are connected to the corresponding inputs of the flip-flops in the first data receiver.

14. The converter of claim 11, wherein the pre-register has m D-type flip-flops without enable control.

15. The converter of claim 14, wherein the pre-register in each conversion cycle refer to m phase clocks to store in order the first m bits in the parallel data.

16. The converter of claim 15, wherein the pre-register in each conversion cycle shifts the stored first m bits back to one of the first data receiver and the second data receiver at a time selected from the last phase clock and the rising edge of the last phase clock referred thereby.

17. The converter of claim 11 further comprising a multiplexer, which receives data from the outputs of the first data receiver and the second data receiver and connects to the selector for determining one of the outputs of the first data receiver and the second data receiver as the parallel data output.

18. The converter of claim 11, wherein $m \geq 1$.

19. The converter of claim 11, wherein $m < n$.

20. A serial-to-parallel data converter for converting a serial data and outputting a n-bit parallel data, comprising:

a phase clock generator, which generates n phase clocks corresponding to the n-bit parallel data in a conversion cycle;

a first data receiver and a second data receiver, whose inputs are connected in parallel and refer to the n phase clocks to latch the n-bit parallel data, wherein the corresponding bits of the n-bit parallel data latched in the first data receiver and the second data receiver refer to the same phase clock; and a selector, which generates a selection signal for selecting one of the first data receiver and the second data receiver for serial data conversion and the other for parallel data output.

21. A serial-to-parallel data converter using a multi-phase clock circuitry to convert a serial data into a parallel data, comprising:

a phase clock generator, which generates a plurality of phase clocks corresponding to the parallel data in a conversion cycles;

a first data receiver and a second data receiver, which alternatively latch the parallel data, wherein the corresponding bits of the n-bit parallel data latched in the first data receiver and the second data receiver refer to the same phase clock and the number of required phase clocks is equal to the bit width of the parallel data;

a pre-register, which pre-stores at least one bit of the parallel data in a conversion cycle and shifts the bit(s) stored therein back to one of the first data receiver and the second data receiver before the conversion cycle ends;

a selector, which generates a selection signal for selecting one of the first data receiver and the second data receiver to latch the parallel data; and a multiplexer, which connects to the outputs of the first data receiver and the second data receiver and receives the selection signal for determining one of the outputs of the first data receiver and the second data receiver as the parallel data output.

22. A serial-to-parallel data conversion method for converting a serial data into a n-bit parallel data, comprising the steps of:

generating n phase clock signals in a conversion cycle;

using the n phase clock signals to convert the serial data into a first parallel data and a second parallel data; wherein the corresponding bits in the first parallel data and the second parallel data refer to the same phase clock signal to latch the serial data, and the first m bits of the serial data are pre-stored in each conversion cycle so that the first m bits in first parallel data and the second parallel data are not lost while switching selecting one of the first parallel data and the second parallel data as output data.

23. The method of claim 22 further comprising the step of shifting the pre-stored first m bits back to one of the first parallel data and the second parallel data before the conversion cycle ends.

24. The method of claim 23 further comprising the step of referring the n phase clocks in each conversion cycle to store in order the first m bits of the serial data.

25. The method of claim 24 further comprising the step of referring the rising edge of the last phase clock in each cycle to shift the pre-stored first m bits back to one of the first parallel data.

26. The method of claim 11, wherein $m \geq 1$.

27. The method of claim 22, wherein $m < n$.

* * * * *